US006992895B2

(12) United States Patent
Lindberg

(10) Patent No.: US 6,992,895 B2
(45) Date of Patent: Jan. 31, 2006

(54) HEAT CONTROLLED OPTOELECTRICAL UNIT

(75) Inventor: Lars Lindberg, Stockholm (SE)

(73) Assignee: Finisar Corporation, Sunnyvale, CA (US)

( * ) Notice: Subject to any disclaimer, the term of this patent is extended or adjusted under 35 U.S.C. 154(b) by 10 days.

(21) Appl. No.: 10/495,851

(22) PCT Filed: Nov. 22, 2002

(86) PCT No.: PCT/SE02/02141

§ 371 (c)(1),
(2), (4) Date: May 18, 2004

(87) PCT Pub. No.: WO03/044917

PCT Pub. Date: May 30, 2003

(65) Prior Publication Data

US 2004/0257738 A1    Dec. 23, 2004

(30) Foreign Application Priority Data

Nov. 23, 2001 (SE) .................................. 0103922

(51) Int. Cl.
*H05K 7/20* (2006.01)

(52) U.S. Cl. ................. 361/719; 361/704; 257/724; 359/152; 359/820; 385/92

(58) Field of Classification Search ........ 361/688–690, 361/703, 704, 719; 257/712, 721–724; 165/80.3, 165/185; 174/16.1, 16.3; 359/820; 385/92, 385/93
See application file for complete search history.

(56) References Cited

U.S. PATENT DOCUMENTS

| 5,235,208 | A  |   | 8/1993 | Katoh |         |
|-----------|----|---|--------|-------|---------|
| 5,513,073 | A  | * | 4/1996 | Block et al. | 361/719 |
| 6,508,595 | B1 | * | 1/2003 | Chan et al. | 385/92 |
| 6,583,902 | B1 | * | 6/2003 | Yuen | 398/135 |
| 6,729,771 | B2 | * | 5/2004 | Kim et al. | 385/76 |

(Continued)

FOREIGN PATENT DOCUMENTS

| DE | 39 22 800   |    | 1/1992 |
|----|-------------|----|--------|
| DE | 19 832 710  |    | 1/2000 |
| DE | 10 013 844  |    | 9/2001 |
| EP | 0 326 207   | A1 | 8/1989 |

(Continued)

OTHER PUBLICATIONS

International Search Report, PCT/SE02/02141, Swedish Patent Office, Jan. 30, 2003.

*Primary Examiner*—Boris Chervinsky
(74) *Attorney, Agent, or Firm*—Workman Nydegger

(57) ABSTRACT

The present invention relates to heat control and cooling of an optoelectrical unit, which converts between electrical and optical signal formats. The optoelectrical unit contains at least one optoelectrical capsule positioned on a circuit board. A primary heat sink is adapted to receive heat energy dissipated from the capsule. The capsule is oriented on the circuit board, such that it presents a relatively small footprint thereon and, at the same time, rises relatively large area sides, which do not face directly towards the circuit board. The primary heat sink has at least one cavity, which is adapted to the shape and dimensions of the capsule, such that the cavity contains at least one capsule. The primary heat couples thermally well to the capsule. Furthermore, the capsules assist in aligning the primary heat sink in its intended position.

17 Claims, 4 Drawing Sheets

U.S. PATENT DOCUMENTS

| | | |
|---|---|---|
| 6,747,820 B2 * | 6/2004 | Zbinden et al. ............. 359/820 |
| 6,754,405 B2 * | 6/2004 | Vendier et al. ............... 385/14 |
| 6,870,746 B2 * | 3/2005 | Leeson et al. .............. 361/816 |
| 2003/0107874 A1 * | 6/2003 | Feigenbaum et al. ....... 361/704 |

FOREIGN PATENT DOCUMENTS

| | | |
|---|---|---|
| JP | 11196055 | 7/1999 |
| WO | WO 1/42840 A1 | 6/2001 |

* cited by examiner

HEAT CONTROLLED OPTOELECTRICAL UNIT

FIELD OF THE INVENTION

The present invention relates generally to heat control and cooling of optical communication equipment. More particularly the invention relates to an optoelectrical unit for converting information signals between an electrical signal format and an optical signal format according to the preamble of claim 1.

THE BACKGROUND OF THE INVENTION AND PRIOR ART

Optical communication systems transport information in the form of modulated light signals. A laser module, e.g. a semiconductor laser (laser=light amplification by stimulated emission of radiation) in a signal transmitter unit is here normally used in order to accomplish the optical signals based on electrical ditto, and a photodetection module, e.g. a photodiode, in a signal receiver unit typically converts the optical signals back into electrical signals again. In most cases, the signal transmitter and a corresponding signal receiver are co-located to form an optoelectrical transceiver unit. These units, in turn, normally operate in an environment that includes one or more other units that dissipate comparatively large amounts of heat energy, such that the ambient temperature becomes fairly high. It is therefore particularly important that the transceiver unit itself is efficiently cooled.

The above transmitter and receiver units should generally be as small as possible with the aim of concentrating the number of processed information bits per physical volume unit and thereby reduce the overall size of the optical communication equipment.

For the same reason, the transmitters and receivers should also be placed as close as possible to each other. However, the photodetection module and the laser module in particular produce a relatively large amount of power losses in the form of heat energy, which must be transported away from the equipment in order to maintain an acceptable working temperature. Normally, there are also restrictions as to the amount of heat energy that may be discharged from a particular unit in order to guarantee that the temperature of any neighboring units stays within an acceptable range. Additionally, there may be a safety incentive to limit the equipment's temperature so as to reduce the risk of burn injuries on the personnel that operate or service the equipment.

In the prior-art transceivers, the transmitter and receiver units are most commonly placed in a respective indentation in the circuit board. Furthermore, the units are usually oriented with their largest side in parallel with the circuit board, such that they show a largest possible interface area towards a heat sink below and/or above the circuit board.

Classically, the heat power losses increase with increased processing speeds/bitrates. A large amount of heat energy, in turn, requires a relatively large interface area towards a cooling medium in order to not result in excessive equipment temperatures. Hence, increasing the ratio of processing capacity per volume or area unit implies a non-trivial optimization problem.

SUMMARY OF THE INVENTION

The object of the present invention is therefore to provide an optoelectrical unit, which alleviates the problem above and thus offers a solution that is comparatively efficient with respect to the processing capacity per volume unit, and at the same time, enables an adequate dissipation of the heat power losses.

According to the invention the object is achieved by the initially described optoelectrical unit for converting information signals between an electrical and an optical signal format, which is characterized in that the unit comprises at least two capsules which each of contains a particular warmest side that radiates more heat energy than any one of the other sides of the respective capsule. Moreover, two of the at least two the two capsules are positioned in relative proximity to each other on the circuit board with their warmest sides substantially perpendicular to each other, such that the two capsules form a general L-shape pattern on the circuit board.

This design is most advantageous, since it combines an efficient usage of the circuit board area with a competent cooling of the optoelectrical capsules.

According to a preferred embodiment of the invention, the warmest side of the capsule is one of the relatively large area sides. This design namely improves the possibilities of accomplishing an efficient cooling via, for example, an air cooled heat sink along the warmest side.

According to another preferred embodiment of the invention, the at least one capsule has the general shape of a rectangular parallelepiped with two relatively large area sides and four relatively small area sides. Naturally, this does not imply that the capsule shape must represent a mathematically perfect rectangular parallelepiped. On the contrary, its sides may be more or less tilted with respect to each other, such that they are either all pair wise parallel to each other or at least two opposite sides being non-parallel to each other. For example, the capsule may describe a truncated pyramid. Moreover, one or more of the capsule's edges and/or corners may be rounded. In any case, the capsule is positioned on the circuit board such that its relatively large area sides are oriented substantially perpendicular to a component side of the circuit board. An advantage accomplished by placing the capsule on its edge like this is that the capsule thereby not only shows a relatively small footprint on the circuit board, a relatively large capsule area also becomes readily accessible for cooling by means of the primary heat sink.

As mentioned initially, one capsule may contain a laser unit, which receives a first electrical information signal and produces in response thereto a first optical information signal. Correspondingly, another capsule may contain a photodetection unit, which receives a second optical information signal and produces in response thereto a second electrical information signal.

According to a preferred embodiment of the invention, the primary heat sink has at least one coupling surface, which is adapted to the shape and dimensions of the optoelectrical capsule. Specifically, this means that the coupling surface is substantially parallel and relatively proximate to at least one side of the capsule. A good thermal coupling is thus accomplished between the capsule and the primary heat sink.

According to another preferred embodiment of the invention, the optoelectrical unit includes at least one thermo conductive gap filler between at least one optoelectrical capsule and at least one coupling surface. The thermo conductive gap fillers are primarily intended to enhance the thermal coupling between the capsule and the primary heat sink by filling any air gap there between. The thermo conductive gap fillers are, however, also advantageous because they assist in accomplishing a good mechanical fit between the capsule and the primary heat sink.

According to yet another preferred embodiment of the invention, the primary heat sink includes at least one cavity, which is adapted to the shape and dimensions of at least one of the capsules. The cavity contains at least two cavity sides that are substantially parallel and relatively proximate to at least two sides of the capsule. This is advantageous, since the thermal coupling between the capsule and the primary heat sink is thereby enhanced.

According to a further preferred embodiment of the invention, the two cavity sides above are substantially parallel and relatively proximate to two sides of each of the at least one capsule, which are also mutually parallel to each other. In other words, the primary heat sink at least partly surrounds the capsule. Naturally, this is preferable, since a comparatively large amount of heat energy from this capsule can thereby efficiently be absorbed by the heat sink. Moreover, the heat sink assists efficiently in holding the capsule in a fixed position on the circuit board.

According to another preferred embodiment of the invention, the primary heat sink is also adapted to receive heat energy, which is dissipated from at least one circuit element on the circuit board in addition to the least one capsule. Such combined heat sink function is advantageous, since it not only facilitates the assembly of the optoelectrical unit. Additionally, the total heat sink capacity is thereby utilized very efficiently. Furthermore, during operation of the unit, the temperature distribution becomes more uniform across the unit. This is in turn desirable, since any mechanical stress on the unit resulting from thermal expansion is thus reduced.

According to a further preferred embodiment of the invention, the primary heat sink contains at least two surfaces, which are substantially parallel and relatively proximate to at least the warmest sides. This warrants for a good thermal coupling between the capsule and the heat sink.

According to yet another preferred embodiment of the invention, the optoelectrical unit comprises a secondary heat sink in addition to the primary heat sink. The secondary heat sink is positioned such that it adjoins the primary heat sink. Heat energy may thereby be transported between the primary heat sink and the secondary heat sink by means of thermo conduction. This is advantageous, since the total heat sink capacity is thereby utilized very efficiently. Moreover it vouches for a comparatively uniform temperature distribution over the unit, which in turn is desirable, for instance from a mechanical stress point of view.

According to a further preferred embodiment of the invention, the secondary heat sink contains an opening, which is adapted to the shape and dimensions of the primary heat sink such that the secondary heat sink adjoins at least two sides of the primary heat sink. Hence, heat energy may efficiently be transported between the two heat sinks. Preferably, the secondary heat sink completely surrounds the primary heat sink, such that the primary heat sink and the secondary heat sink form a joint outer surface of the optoelectrical unit.

According to a still further preferred embodiment of the invention, the secondary heat sink is also adapted to receive heat energy from at least one circuit element outside the coverage area of the primary heat sink. Thus, the heat sink arrangement's cooling capabilities become effective for other units than the optoelectrical capsules, which generally is desirable. Preferably, a thermo conductive gap filler is included between said at least one circuit element and the secondary heat sink. This namely both enhances the thermo conductive coupling there between and accomplishes a good mechanical fit between the capsule and the heat sink.

To sum up, the invention offers a highly efficient solution for cooling communication equipment in the form of optoelectrical units. Thereby the temperature of these units, as well as any neighboring units, may be maintained within a well-defined range. Naturally, the invention will therefore provide a competitive edge to any communication system where optical transmitters are utilized for the transmission of information.

BRIEF DESCRIPTION OF THE DRAWINGS

The present invention is now to be explained more closely by means of preferred embodiments, which are disclosed as examples, and with reference to the attached drawings.

DESCRIPTION OF PREFERRED EMBODIMENTS OF THE INVENTION

Figure 1:
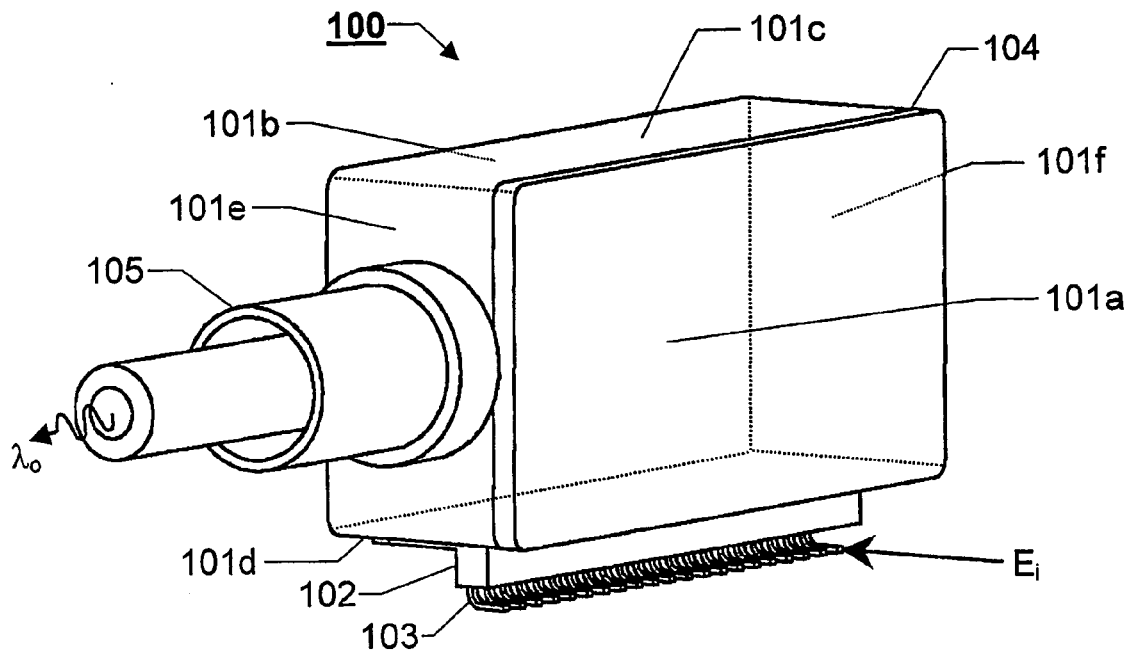
FIG. 1 shows a capsule containing a laser unit according to an embodiment of the present invention.

Conventionally, the optoelectrical units (such as lasers and photodetectors) in optoelectrical transceivers have been oriented with their largest side in parallel with the circuit board on which they are mounted. A largest possible interface area has thereby been accomplished towards at least one heat sink being placed either below, above or both below and above the circuit board. This design, however, results in a relatively large footprint for each optoelectrical unit, which in turn consumes valuable circuit board area that could have been used by other units. Therefore, the present invention proposes that the optoelectrical units instead be placed on their edges, i.e. with a capsule side having a comparatively small area towards the circuit board. FIG. 1 shows a first example of this strategy, where a capsule 100 containing a laser unit stands on one of its relatively small area sides 101d. The laser capsule 100 is presumed to have the general shape of a rectangular parallelepiped with two relatively large area sides 101a; 101b and four relatively small area sides 101c, 101d, 101e and 101f. The latter may either all have substantially the same size, or as illustrated in FIG. 1, have two somewhat larger sides 101c; 101d and two somewhat smaller sides 101e; 101f. Although the exact relationship between the relatively large area sides 101a; 101b and the relatively small area sides 101c–f is not critical for the proposed solution, the relatively large area sides 101a; 101b should preferably have at least 50% larger area than the largest of the relatively small area sides 101c–f. It is furthermore advantageous, from an assembly point of view, if the capsule 100 is mounted such that the relatively large area sides 101a; 101b are oriented substantially perpendicular to the circuit board. A feedthrough 102 in the bottom side 101d of the capsule 100 contains one or more electrical leads 103 via which an incoming electrical signal $E_i$ is received to the laser unit. Preferably, the electrical leads 103 constitute ceramic conductors in the feedthrough 102 in order to make possible a high lead density. The laser unit produces an outgoing optical signal $\lambda_o$ in response to the electrical signal $E_i$ that represents the same information. The optical signal $\lambda_o$ is fed out from the capsule 100 to an optical fiber (not shown) via an optical connector 105, for example of LC-type (Lucent), SC-type (subscriber connector) or MU-type (NTT). Here, the optical connector 105 is attached to one of the relatively small area sides 101e. Technically however, it may equally well be attached to one of the relatively large area sides 101a or 101b.

According to a preferred embodiment of the invention, one of the relatively large area sides 101a radiates more heat energy than any one of the other sides 101b–101f. I.e. this relatively large area side 101a is the warmest side of the capsule 100. For example, this may be due to the fact that the laser unit is mounted on the inside of this particular side 101a (see FIG. 3). Preferably, the capsule 100 also contains a thermoelectric module (such as a Peltier device), which actively transports heat energy from the laser unit towards the side 101a of the capsule 100 exterior.

Figure 2:
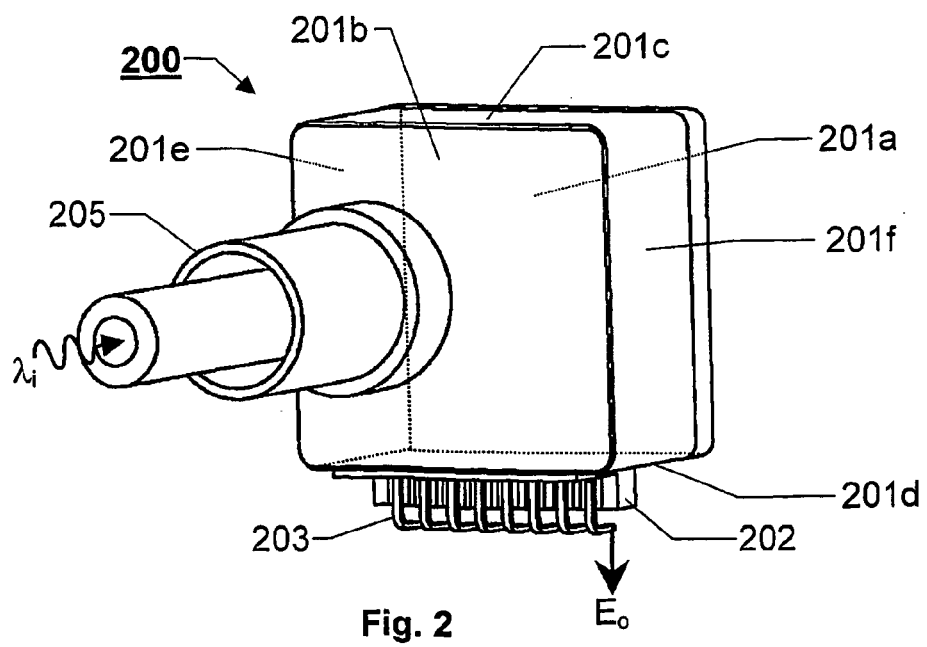
FIG. 2 shows a capsule containing a photodetection unit according to an embodiment of the present invention.

FIG. 2 shows a second example of a capsule 200 that contains an optoelectrical unit according to an embodiment of the present invention. In analogy with the capsule 100 shown in FIG. 1 above, the photodetection capsule 200 is presumed to have the general shape of a rectangular parallelepiped with two relatively large area sides 201a; 201b and four relatively small area sides 201c, 201d, 201e and 201f. The photodetection capsule 200 is intended to stand on one of its relatively small area sides 201d on a circuit board. As is apparent from the figure, the relatively small area sides 201c–f all have approximately the same size. However, the relatively small area sides 201c–f may equally well have sizes, which are substantially different in pairs, i.e. represent two somewhat larger sides and two somewhat smaller sides. Although again, the exact relationship between the relatively large area sides 201a; 201b and the relatively small area sides 201c–f is not critical for the proposed solution, the relatively large area sides 201a; 201b should preferably have at least 50% larger area than the largest of the relatively small area sides 201c–f. It is furthermore advantageous, from an assembly point of view, if the capsule 200 is mounted such that the relatively large area sides 201a; 201b are oriented substantially perpendicular to the circuit board.

According to a preferred embodiment of the invention, the capsule 200 receives an incoming optical signal $\lambda_i$ from, for example, an optical fiber (not shown) via an optical connector 205 on one of the capsule's 200 relatively large area sides 201b. Preferably, if the optical connector 105 referred to above is attached to one of the relatively small area sides 101c–f of the laser capsule 100, the optical connector 205 should be attached to one of the relatively large area sides 201a or 201b of the photodetection capsule 200, and vice versa. The optical connector 205 may for instance be of LC-type (Lucent), SC-type (subscriber connector) or MU-type (NTT). The photodetection unit within the capsule 200 converts the optical signal $\lambda_i$ into a corresponding electrical signal $E_o$ that represents the same information. A feedthrough 202 in a bottom side 201d of the capsule 200 contains one or more electrical leads 203 via which the electrical signal $E_o$ is delivered to other circuit elements for further processing. Preferably, the electrical leads 203 constitute ceramic conductors in the feedthrough 202 in order to make possible a high lead density.

According to a preferred embodiment of the invention, one of the relatively large area sides 201a radiates more heat energy than any one of the other sides 201b–201f and is thus the warmest side of the capsule 200. For example, this may be due to the fact that the photodetection unit is mounted on the inside of this particular side 201a. The capsule 200 may also contain a thermoelectric module (such as a Peltier device), which actively transports heat energy from the photodetection unit towards the warmest side 201a of the capsule 200 exterior.

Figure 3:
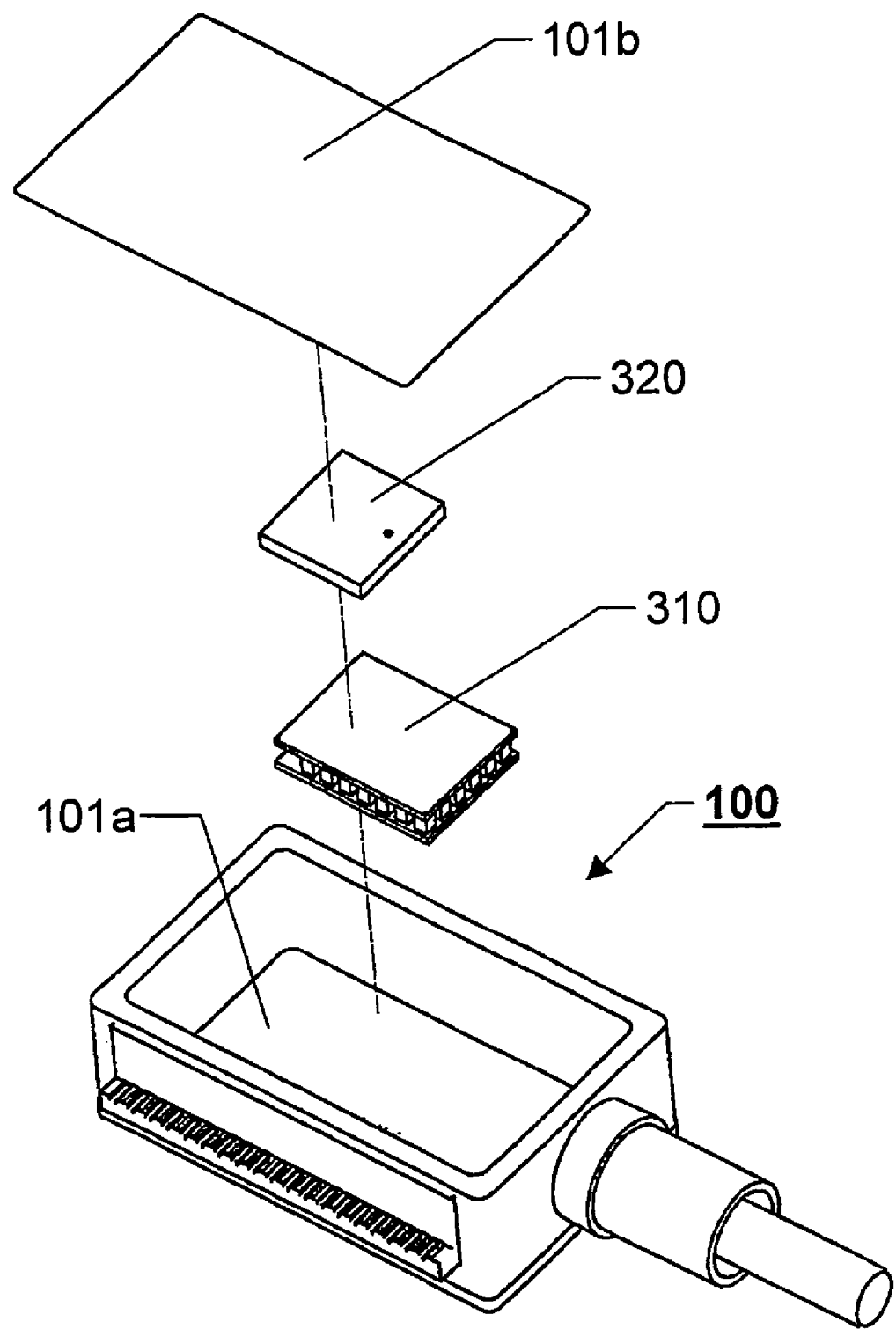
FIG. 3 shows an exploded diagram over a laser capsule according to an embodiment of the invention.

FIG. 3 shows an exploded diagram over a laser capsule 100 according to an embodiment of the invention. Here, an optoelectrical component in the form of a laser unit 310 is mounted on the inside of a side 101a of the laser capsule 100. A control circuitry 320 for the laser unit 310 is in turn positioned on top of this unit 310. Preferably, the capsule 100 also contains a thermoelectric module (not shown), which actively transports heat energy from the laser unit 310 towards the exterior of the capsule side 101a. A capsule side 101b in the form of a lid is used to seal the capsule 100 after assembly of the units therein.

Figure 4:
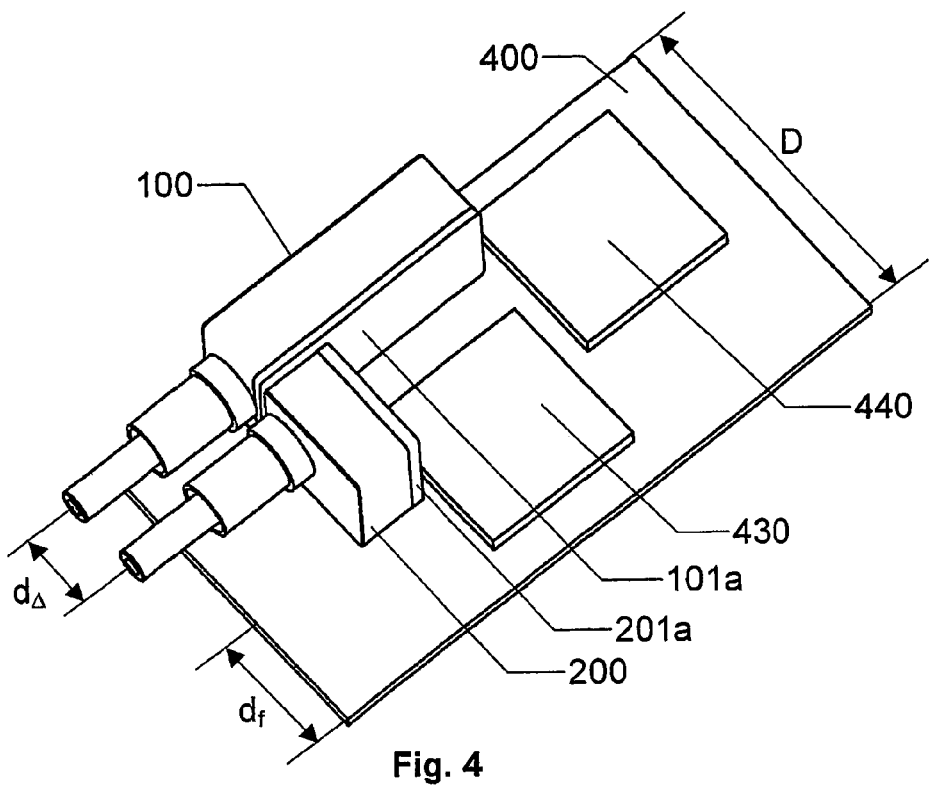
FIG. 4 depicts a circuit board according to an embodiment of the invention, which comprises the capsules shown in FIGS. 1–3.

FIG. 4 depicts a circuit board 400 according to an embodiment of the invention, which comprises a laser capsule 100 and a photodetection capsule 200 as described above. Both these capsules 100 and 200 are positioned on the circuit board 400 such that their relatively large area sides 101a, 101b and 201a, 201b respectively are oriented substantially perpendicular to a component side of the circuit board 400. For a given width D of the circuit board 400, this leaves a relatively large front space $d_f$ that can be used for other purposes than connecting optical fibers, for example displays (not shown) to indicate a transceiver status. Moreover, the distance $d_A$ between the optical connectors 105 and 205 can thereby be made comparatively short.

The capsules 100 and 200 are here presumed to have a respective warmest side 101a and 201a. Preferably, the capsules 100 and 200 are positioned relatively close to each other with their warmest sides 101a; 201a substantially perpendicular to each other, such that the capsules 100 and 200 form a general L-shape pattern on the circuit board 400. The circuit board 400 may also include a first circuit 430 and a second circuit 440 in addition to the capsules 100 and 200, for instance for pre- and post-processing of the electrical signals $E_i$ and $E_o$.

Figures 5A, 5B:
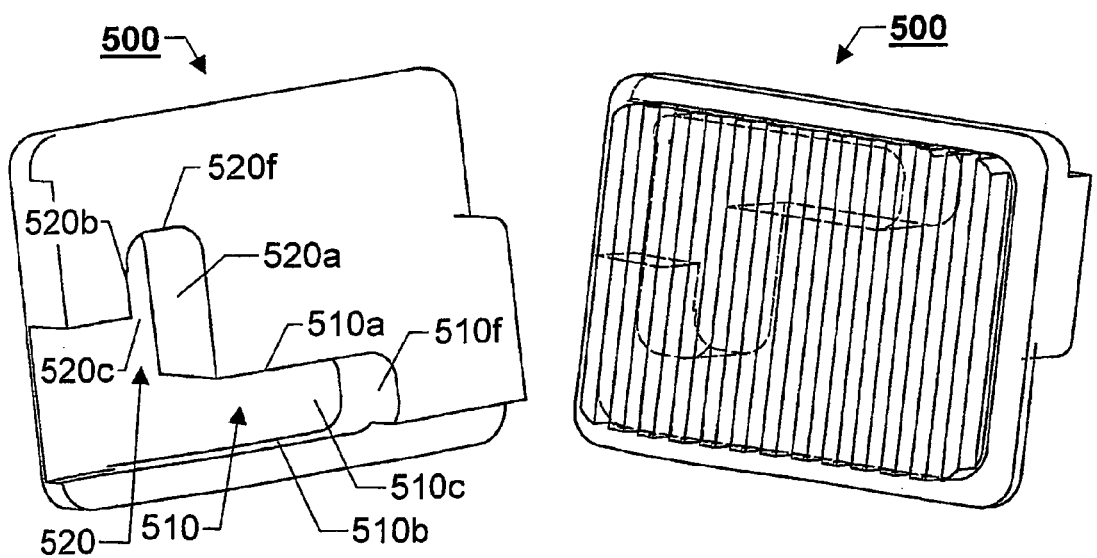
FIG. 5a shows a bottom-view of a primary heat sink according to an embodiment of the invention.
FIG. 5b shows a corresponding top-view of the primary heat sink according to the embodiment shown in FIG. 5a, and FIG. 6 represents an exploded diagram over an entire optoelectrical unit according to an embodiment of the invention.

FIG. 5a shows a bottom-view of a primary heat sink 500 according to an embodiment of the invention, which is to be placed on top of the capsules 100 and 200 when mounted on a circuit board 400, as described with reference to FIG. 3 above. The primary heat sink 500 contains a first cavity 510, which is adapted to the shape and dimensions of the laser capsule 100 and a second cavity 520, which is adapted to the shape and dimensions of the photodetection capsule 200. The cavities 510 and 520 each contains a multitude of so-called coupling surfaces 510a, 510b, 510c and 510f respective 520a, 520b, 520c and 520f. The coupling surfaces 510a, 510b, 510c, 510f, 520a, 520b, 520c and 520f are cavity sides that are substantially parallel and relatively proximate to the same number of sides of the respective capsule 100 and 200 when the primary heat sink 400 is placed in its intended position. A good thermal coupling is thereby accomplished between the capsules 100; 200 and the primary heat sink 500.

According to a preferred embodiment of the invention, the primary heat sink 500 is designed such that it contains at least two surfaces, which are substantially parallel and relatively proximate to at least said warmest sides 101a and 201a of the capsules 100 and 200. In FIG. 5a, the cavity side 510a of the first cavity 510 respective the cavity side 520a of the second cavity 520 represent these surfaces.

Preferably, the cavities 510 and 520 contain two cavity sides (coupling surfaces) 510a and 510b respective 520a and 520b, which are mutually parallel to each other and that are substantially parallel and relatively proximate to at least two sides 101a, 101b; 201a, 201b of the respective capsule 100 and 200 when the primary heat sink 500 is placed in its intended position over the capsules 100 and 200. This ensures a first-class thermal coupling between the capsules 100; 200 and the primary heat sink 500. Furthermore, it accomplishes a good mechanical fit between the capsules 100 and 200 and the primary heat sink 500, such that the capsules 100 and 200 assist in lining up the primary heat sink 500 in its intended position. An efficient cooling of the capsules 100 and 200 is thus achieved, even in case one of the capsules 100 and 200 (for some reason) is slightly misaligned from its intended position.

Figure 6:
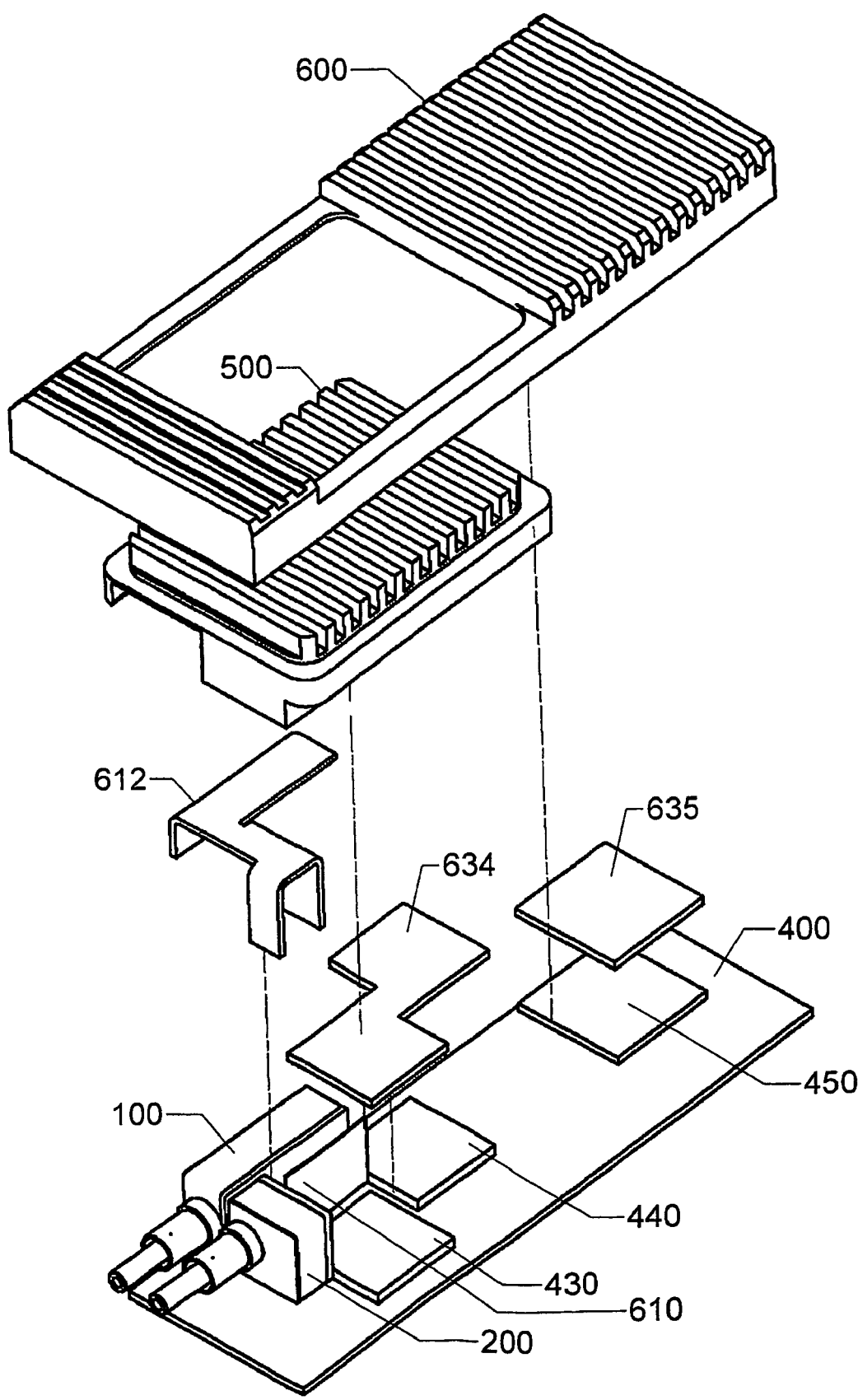

According to another preferred embodiment of the invention, the primary heat sink 500 is also designed such that it covers at least a part of at least one of the first circuit element 430 and the second circuit element 440 (see FIG. 6). The primary heat sink 500 is hence capable of receiving heat energy being dissipated from this(these) circuit element(s).

A semi-transparent top-view of the primary heat sink 500 shown in FIG. 5a is illustrated in FIG. 5b. The heat sink 500 preferably has planar inner surfaces and may, but need not, be equipped with radiating fins on its topmost outer surface.

FIG. 6 represents an exploded diagram over an entire opto-electrical unit according to an embodiment of the invention. The circuit board 400 comprises a laser capsule 100, a photo-detection capsule 200 and three other circuit elements 430, 440 and 450 respectively. The capsules 100 and 200 and the first and second circuit elements 430; 440 are positioned in accordance with what has been described with reference to the FIGS. 4 and 5a above.

A first thermo conductive gap filler, e.g. a thermo conductive pad, silicone or an equivalent gel 612 is attached on the top face and/or at least one side face of the capsules 100 and 200 in order to enhance the thermal coupling between the relevant capsule(s) 100; 200 and the primary heat sink 500. A corresponding second gap filler 610 is attached to the warmest side of the laser capsule 100. Likewise, a third gap filler 634 is attached on the upper surfaces of the first circuit element 430 and the second circuit element 440.

The primary heat sink 500 is fitted onto the capsules 100 and 200 after attaching the gap fillers 610, 612 and 634. Moreover, the first and second gap fillers 612 and 610 thereby removes any play between the capsules 100; 200 the primary heat sink 500. The capsules 100 and 200 thus assist in lining up the primary heat sink 500 in its intended position.

According to the illustrated embodiment of the invention, the optoelectrical unit comprises a secondary heat sink 600, which physically adjoins the primary heat sink 500, such that heat energy may be transported between the primary heat sink 500 and the secondary heat sink 600 by means of thermo conduction. Preferably, the secondary heat sink 600 contains an opening, which is adapted to the shape and dimensions of the primary heat sink 500 so as to adjoin at least two sides of the primary heat sink 500. For example, the secondary heat sink 600 may completely surround the primary heat sink 500 (as shown in FIG. 6) and hence accomplish an excellent thermal coupling between the units 500 and 600. Furthermore, the heat sinks 500; 600 may be designed such that they form a joint outer surface of the optoelectrical unit. Roughly speaking, this means that the optoelectrical unit constitutes a sealed tight unit, which in turn, implies advantageous environmental attributes and provides a good electromagnetic compatibility (EMC) respective shielding against electromagnetic interference (EMI).

According to a preferred embodiment of the invention, the secondary heat sink 600 is adapted to receive heat energy from a third circuit element 450 on the circuit board 400, which is positioned outside a coverage area of the primary heat sink 500. A fourth thermo conductive gap filler 635 is preferably attached on the upper surface of this circuit element 450 in order to ensure a good thermal coupling also between the circuit element 450 and the secondary heat sink 600. Naturally, the third circuit element 450 may equally well be located on a different circuit board than the circuit board 400, which contains e.g. the capsules 100; 200 and any circuit elements 430; 440.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

What is claimed is:

1. An optoelectrical unit for converting information signals between an electrical signal format and an optical signal format, comprising:
   a circuit board which contains at least two optoelectrical capsules, the at least two capsules being positioned on the circuit board such that their respective footprint towards the circuit board has a smaller area than the area of a largest side of the capsule, and
   a primary heat sink adapted to receive heat energy being dissipated from at least one of the at least two optoelectrical capsules, wherein
   each of the at least two capsules contains a particular warmest side radiating more heat energy than any one of the other sides of the respective capsule, and
   two of the at least two capsules are positioned in relative proximity to each other on the circuit board with their warmest sides substantially perpendicular to each other such that the two capsules form a general L-shape pattern on the circuit board.

2. An optoelectrical unit according to claim 1, wherein the warmest side is one of the relatively large area sides.

3. An optoelectrical unit according to claim 1, wherein each of the at least two capsules has the general shape of a rectangular parallelepiped with two relatively large area sides and four relatively small area sides, and the at least two capsules are positioned on the circuit board such that their relatively large area sides are oriented substantially perpendicular to a component side of the circuit board.

4. An optoelectrical unit according to claim 3, wherein the primary heat sink comprises at least one coupling surface adapted to the shape and dimensions of at least one of the at least two optoelectrical capsules such the at least one coupling surface is substantially parallel with and relatively proximate to at least one side of said at least two capsules.

5. An optoelectrical unit according to claim 4, wherein the unit comprises at least one thermo conductive gap filler between at least one of the at least two optoelectrical capsules and at least one of the at least one coupling surface.

6. An optoelectrical unit according to claim 4, wherein the primary heat sink comprises at least one cavity adapted to the shape and dimensions of at least one of the at least two capsules such that the at least one cavity contains at least two cavity sides being substantially parallel with and relatively proximate to at least two sides of at least one of the at least two capsules.

7. An optoelectrical unit according to claim 6, wherein the at least two cavity sides are substantially parallel with and relatively proximate to at least two mutually parallel sides of at least one of the least two capsules.

8. An optoelectrical unit according to claim 1, wherein the primary heat sink is adapted to receive heat energy being dissipated from at least one circuit element on the circuit board in addition to the least two capsules.

9. An optoelectrical unit according to claim 1, wherein the primary heat sink contains at least two surfaces being substantially parallel and relatively proximate to at least said warmest sides.

10. An optoelectrical unit according to claim 1, wherein the unit comprises a secondary heat sink adjoining the primary heat sink such that heat energy may be transported between the primary heat sink and the secondary heat sink by means of thermo conduction.

11. An optoelectrical unit according to claim 10, wherein the secondary heat sink contains an opening adapted to the shape and dimensions of the primary heat sink such that the secondary heat sink adjoins at least two sides of the primary heat sink.

12. An optoelectrical unit according to claim 11, wherein the secondary heat sink surrounds the primary heat sink and that said heat sinks form a joint outer surface of the optoelectrical unit.

13. An optoelectrical unit according to claim 10, wherein the secondary heat sink is adapted to receive heat energy being dissipated from at least one circuit element outside a coverage area of the primary heat sink.

14. An optoelectrical unit according to claim 1, wherein at least one of the at least two capsules contains a laser unit receiving a first electrical information signal and producing in response thereto a first optical information signal.

15. An optoelectrical unit according to claim 1, wherein at least one of the at least two capsules contains a photodetection unit receiving a second optical information signal and producing in response thereto a second electrical information signal.

16. An optoelectrical unit according to claim 1, wherein at least one of the at least two capsules contains a thermoelectric module actively transporting heat energy from an optoelectrical component inside the capsule towards the exterior of the capsule.

17. An optoelectrical unit according to claim 16, wherein the thermoelectric module includes a Peltier device.

\* \* \* \* \*

UNITED STATES PATENT AND TRADEMARK OFFICE
CERTIFICATE OF CORRECTION

PATENT NO. : 6,992,895 B2  Page 1 of 1
APPLICATION NO. : 10/495851
DATED : January 31, 2006
INVENTOR(S) : Lars Lindberg It is certified that error appears in the above-identified patent and that said Letters Patent is hereby corrected as shown below:

Column 2
Line 13, change "which each of" to --each of which--
Line 16, before "capsules" remove [the two]

Column 3
Line 67, change "other units" to --units other--

Column 6
Line 58, change "contains" to --contain--
Line 59, change "and 510f" to --510f--
Line 60, change "respective 520a, 520b, 520c and 520f."
    to --and 520a, 520b, 520c, 520f, respectively.--

Column 7
Line 7, change "capsule" to --capsules--
Line 54, after "100; 200" insert --and--
Line 55, change "removes" to --remove--

Column 9
Line 15 claim 8, before "least" insert --at--
Line 19 claim 8, before "least" insert --at--

Signed and Sealed this

Eighteenth Day of March, 2008

JON W. DUDAS
*Director of the United States Patent and Trademark Office*